United States Patent [19]
Inoue

[11] 4,143,456
[45] Mar. 13, 1979

[54] SEMICONDUCTOR DEVICE INSULATION METHOD

[75] Inventor: Kazuo Inoue, Higashimurayama, Japan

[73] Assignee: Citizen Watch Commpany Ltd., Tokyo, Japan

[21] Appl. No.: 808,216

[22] Filed: Jun. 20, 1977

[30] Foreign Application Priority Data

Jun. 28, 1976 [JP] Japan .................................. 51-76213
May 11, 1977 [JP] Japan .................................. 52-54070

[51] Int. Cl.² ....................... B01J 17/00; H01L 1/10; H05K 3/28
[52] U.S. Cl. ...................................... 29/588; 357/72; 357/80; 29/589; 29/627; 174/52 PE
[58] Field of Search ............... 357/70, 72, 80; 29/588, 29/589, 575, 577, 626, 627; 174/52 PE

[56] References Cited
U.S. PATENT DOCUMENTS

| 3,381,071 | 4/1968 | Logan et al. | 357/80 |
| 3,622,419 | 11/1971 | London | 357/72 |
| 3,778,686 | 12/1973 | Galvin et al. | 357/80 |
| 3,938,177 | 2/1976 | Hansen et al. | 357/70 |

*Primary Examiner*—Andrew J. James
*Attorney, Agent, or Firm*—Frank J. Jordan

[57] ABSTRACT

A method for applying a protective covering for a semi-conductor device which comprises a circuit board having formed thereon a conductive pattern on which a chip of the semi-conductor device is mounted and electrically connected to said conductive pattern, an insulating resin film having a low surface energy to provide a repellent property and formed on said circuit board around the chip of the semi-conductor device by a printing technique, and a resin molded seal formed on said circuit board to conseal said chip within a space defined by said insulating resin film, the flow of resin being blocked by the repellent property of said insulating resin film during a molding process.

8 Claims, 5 Drawing Figures

SEMICONDUCTOR DEVICE INSULATION METHOD

This invention relates to a mounting structure for a semi-conductor device, and more particularly to a construction of a seal for a resin molded semi-conductor device of the type that are used in electronic timepieces which employ a crystal controlled oscillator.

In recent years there has been a growing tendency toward the adoption of quartz crystals in electronic wristwatches and increasing demand for such timepieces which make use of crystal controlled oscillators. At the same time, there is ever greater demand for crystal controlled wristwatches which are compact, slender, low in cost and capable of delivering high performance. Most of these wristwatches include a circuit block comprising a crystal controlled oscillator which oscillates at a frequency of 32,768 Hz, an integrated circuit composed of semi-conductors for frequency dividing and driving purposes, electrical elements such as capacitors, and a circuit board with an electrically conductive pattern for mounting all of the above-mentioned components. Since the circuit block occupies a large amount of space, it has been difficult to greatly reduce the size of timepieces, and methods by which compact, slender circuit blocks can be realized without complicating the production procedure are now being sought.

In recent years, commercially available sealing or mounting constructions for semi-conductor devices have come to make use of resin molded type constructions rather than those of the air-tight sealing type. The resin molded type is slightly less reliable than the air-tight sealing type but is expected to come into wider use as it exhibits a great number of advantages such as allowing semi-conductors to be integrally mounted on a circuit board, provided with wiring patterns, in such a manner as affords a compact, thin structure at low cost.

It is, therefore, an object of the present invention to provide a highly reliable sealing structure for a semi-conductor device that obviates the drawbacks encountered in the prior art techniques and which is capable of being fabricated in a slender, compact size at low cost.

It is another object of the present invention to provide a method of sealing a semi-conductor device on a circuit board to provide a slender and compact construction.

These and other objects, features and advantages of the present invention will become more apparent from the following description when taken in conjunction with the accompanying drawings, in which.

Figure 1:
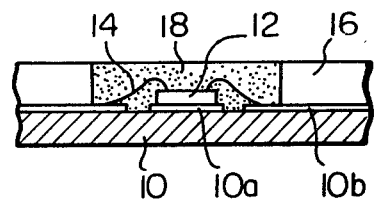
FIG. 1 is a cross sectional view of a conventional sealing structure for a resin molded semi-conductor.

FIG. 1 is a cross-sectional view showing the mounting construction of a liquid-state resin molded semi-conductor device in accordance with the technique of the prior art. Reference numeral 10 denotes a circuit board made of a ceramic, glass or epoxy on which a prescribed electrically conductive pattern is formed. Reference numeral 12 designates a semi-conductor chip which is fixed by a eutectic or electrically conductive adhesive to the die bonded portion 10a of the pattern formed on the circuit board, and electrically connected to the lead portion 10b of the pattern by means of a metal or aluminum wire 14. Reference numeral 16 denotes a frame which has the effect of blocking the flow of the molded portion 18 consisting of an epoxy resin or the like, and also serves to shape the molded portion 18. Formation of the frame 16 may be accomplished by the adherence of a frame consisting of a material, such as plastic, different from that of the molded portion, or by building up layers of the material on the circuit board.

Figure 3:
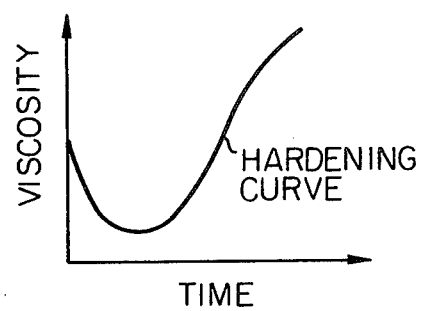
FIG. 3 is a graphical representation of a hardening characteristic of an epoxy resin in case of constant hardening temperature.

This method of constructing a liquid-state resin molded semi-conductor device is the conventional method which has been in general practice. The technique entails the formation of the frame 16 and thus can not be accomplished at low cost. Sufficient space in all three demensions is required so that components cannot be mounted in a compact manner. Further, with regard to the hardening of the epoxy resin which forms the molded portion 18, FIG. 3 shows that the viscosity of the epoxy temporarily decreases at high temperatures so that the epoxy readily flows. In consequence, frame 16 does not completely halt the flow of the resin which thus contacts the adjacent pattern and is likely to subject it to damage. These and other disadvantages offer a number of major problems in crystal controlled electronic timepieces and similar devices which require a compact, slender construction at low cost. In order to facilitate the low cost construction of slender, compact resin molded semi-conductors, there is thus a requirement that frames not be utilized and that the mounting structure be capable of production by a simple procedure which can be readily automated.

Thus, the present invention proposes to provide a sealing construction and method for a liquid-state resin molded semi-conductor device that obviates the aforementioned defects of the prior art technique and which is capable of being simply fabricated in small size through an automated procedure without the utilization of frames or similar means.

Figure 2A:
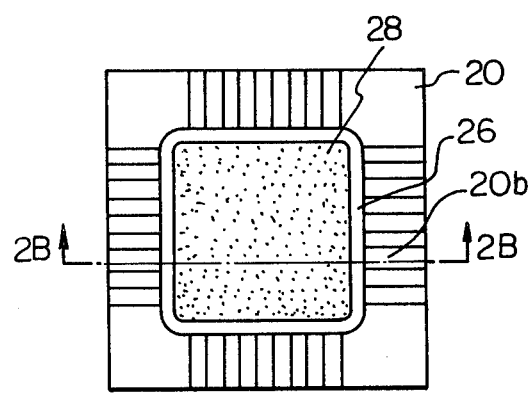
FIG. 2A is a plan view illustrating one example of a method for applying a protecting covering for a semi-conductor device according to the present invention.
Figure 2B:
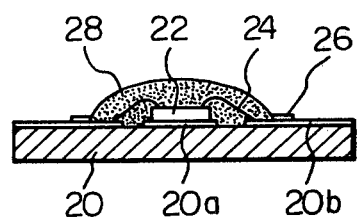
FIG. 2B is a cross sectional view taken on line 2B—2B in FIG. 2A.

FIG. 2A is a plan view illustrating a method for applying protective covering for a semi-conductor device, in accordance with the present invention, and FIG. 2B is a cross-sectional view of FIG. 2A taken along the line 2B—2B. Reference numeral 20 denotes a circuit board made of a ceramic or glass epoxy on which an electrically conductive pattern is formed by means of a metallization or etching procedure. A semi-conductor chip 22 is fixed to the die bonded portion 20a of the pattern by means of a eutectic or electrically conductive adhesive, and is electrically connected to the lead portion 20b of the pattern by a metal or aluminum wire 24. Reference numeral 26 denotes an insulator in the form of a film which is formed in advance about the outer periphery of the intended resin molded seal. Insulator 26 is made of a material which has a low surface energy to exhibit repellency property and consists of an electrically insulative silicon resin or fluorine resin which serves to block the flow of and shape the molded portion 28 consisting of an epoxy resin or the like. This process makes it possible to build up a mold from the surface of the circuit board 20 or to form a mold of any irregular shape, to form a protective convering for semiconductor chip 22. The insulator 26 can be readily formed into a film by means of a thick film printing or stamp printing technique.

The results of an experiment will now be given for the purpose of describing a concrete example of the invention.

A prescribed pattern was formed on a circuit board consisting of a glass epoxy. Using a silicone resin as the insulator 26, a film of the insulator having a width of 0.4mm and a thickness of 0.02mm was formed by a stamp printing process so as to produce a predetermined shape such as a square having a side of 5mm. Upon molding the epoxy resin within the square insulator 26, a rounded molded portion having a maximum thickness of 1.2mm at its central portion was formed. Of particular importance here is the use of a silicone resin or fluorine resin having the repellency property as the insulator 26. Thus, even if the epoxy resin experiences a temporary drop in viscosity during the hardening process, as shown in FIG. 3, it suffices only to form a simple film of the insulator due to its repellent property. It was confirmed by the experiment that the film of the insulator formed in this manner is sufficiently effective in blocking the flow of the epoxy resin.

Figure 4:
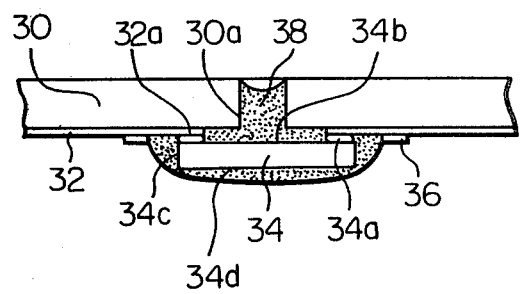
FIG. 4 is a cross sectional view showing another preferred example of a method according to the present invention.

FIG. 4 shows the construction of another preferred example of a semi-conductor device insulation method in accordance with the present invention. Reference numeral 30 denotes a circuit board made of a ceramic or glass epoxy or the like on which an electrically conductive pattern 32 is formed. Reference numeral 34 designates a semi-conductor chip the projecting electrode 34a of which is positioned so as to agree with the position of the bonding electrode portion 32a of the electrically conductive pattern 32. At the same time, the chip is joined to the circuit board by means of a face-down bonding method. Reference numeral 30a denotes a through-hole board through the circuit board 30 at a position opposite the obverse side of the semi-conductor chip, and serves as a passage through which the resin molded portion 38 consisting of an epoxy or similar resin will be injected. This is accomplished by a dispenser which injects the resin from the back side of circuit board 30 through hole 30a so as to fill the gap defined between the surface 34b of the semi-conductor chip and the circuit board while covering the side portion 34c of the semi-conductor chip as well as its reverse side 34d. At this time, the flow of the resin molded portion 38 along the surface of the circuit board is blocked and the portion 38 shaped by means of a repellent insulator 36 selected from the group consisting of a silicone resin and or fluorine resin formed into a frame-like configuration. The insulator 36 can readily be formed by a stamp printing or similar technique and is adaptable to an automated assembly line type of production. The flow blocking effect of the insulator 36 depends upon the pressure at which the dispenser injects the resin, the time utilized for the operation, the viscosity of the resin molded portion 38, as well as the shape of the insulator 36 and the desired shape of the molded portion. In an experiment performed by the applicant, a molded portion having a thickness of less than 500 μm as measured from the reverse side 34d of the semi-conductor chip was obtained by an insulator having a thickness of 50 μm and a width of 200 μm, the insulator being disposed at a distance of 400 μm from the sides of the semi-conductor chip and formed so as to surround it. The molded semi-conductor chip so obtained is well suited to application in the water-proof case of a timepiece, affords sufficient protection against the external atmosphere and exhibits stable characteristics for a long period of time.

In accordance with the invention as described, a through-hole is formed in a circuit board so that a molding resin injected from the back side of the same completely covers the surface of a semi-conductor ship. Since the injected resin flows along the surface of the circuit board, the flow can be blocked and the resin shaped merely by forming a frame-shaped water-repellent insulator on the circuit board by means of a printing process. The simple provision of a through-hole and a repellent resin makes it possible to provide, at low cost and without any complication in procedure, a highly reliable water-tight mounting construction for a resin molded semiconductor device, one which is particularly slender and compact in size.

Although the present embodiment describes a case in which a semi-conductor is mounted on a ceramic or glass epoxy circuir board and then sealed by a resin molding procedure so as to provide a sealed construction for a resin molded semi-conductor device, the present invention can also be easily applied to a sealing construction for cases in which such elements as resistors or capacitors or other semiconductors are mounted on such common circuit boards as epoxy, polyester or phenol circuit boards and then subjected to the resin molding procedure.

What is claimed is:

1. A process for applying a protecting covering for a semiconductor device having a circuit board formed on its one surface with an electrically conductive pattern, a die bonded portion, and a semiconductor chip mounted on said die bonded portion and electrically connected to said electrically conductive pattern, said process comprising the steps of:
   forming a thick film of a repellent insulating material on said one surface of said circuit board in a predetermined shape around said semiconductor chip by a printing technique, said repellent insulating material being selected from the group consisting of silicone resin and fluorine resin;
   molding a resin material onto said one surface of said circuit board in an area surrounded by said predetermined shape, said thick film of repellent insulating material blocking the flow of said resin material at an area outside said predetermined shape; and
   hardening said resin material to form a protecting covering for said area surrounded by said predetermined shape.

2. A process according to claim 1, in which said resin material consists of an epoxy resin.

3. A process according to claim 1, in which said thick film has a thickness of about 50 μm and a width of about 200 μm.

4. A process according to claim 1, in which said thick film is formed at a distance of about 400 μm from the sides of said semiconductor chip.

5. A process for applying a protecting covering for a semiconductor device having a circuit board formed on its one side with an electrically conductive pattern having a bonding electrode portions, and a semiconductor chip having projecting electrodes joined to the bonding electrode portions of said electrically conductive pattern, wherein said circuit board has a through-hole opening to a bottom surface of said semiconductor chip, said process comprising the steps of:

forming a thick film of a repellent insulating material on said one side of said circuit board in a predetermined shape around said semiconductor chip by a printing technique, said repellent insulating material being selected from the group consisting of silicone resin and fluorine resin;

injecting a mold resin from another side of said circuit board through the through-hole thereof onto said one side of said circuit board in an area surrounded by said predetermined shape, said thick film of repellent insulating material blocking the flow of said resin material at an area outside said predetermined shape; and hardening said mold resin to form a protecting covering for said area surrounded by said predetermined shape.

6. A process according to claim 5, in which said resin material consists of an epoxy resin.

7. A process according to claim 5, in which said thick film has a thickness of about 50 $\mu$m and a width of about 200 $\mu$m.

8. A process according to claim 5, in which said thick film is formed at a distance of about 400 $\mu$m from the sides of said semiconductor chip.

* * * * *